(12) United States Patent
Kuzuhara et al.

(10) Patent No.: US 8,598,608 B2
(45) Date of Patent: Dec. 3, 2013

(54) LIGHT EMITTING DEVICE

(75) Inventors: Ikko Kuzuhara, Toyonaka (JP); Kouji Nishioka, Kurayoshi (JP)

(73) Assignee: Panasonic Corporation, Osaka (JP)

( * ) Notice: Subject to any disclaimer, the term of this patent is extended or adjusted under 35 U.S.C. 154(b) by 34 days.

(21) Appl. No.: 13/067,716

(22) Filed: Jun. 22, 2011

(65) Prior Publication Data
US 2011/0316025 A1 Dec. 29, 2011

(30) Foreign Application Priority Data

Jun. 25, 2010 (JP) ................................ 2010-144504

(51) Int. Cl.
*H01L 33/00* (2010.01)
(52) U.S. Cl.
USPC ..................................... 257/98; 257/E33.061
(58) Field of Classification Search
USPC ............................................ 257/98, E33.061
See application file for complete search history.

(56) References Cited

U.S. PATENT DOCUMENTS

| 6,858,456 B2 | 2/2005 | Noguchi et al. | |
| 2005/0224818 A1* | 10/2005 | Harada | 257/79 |
| 2008/0048200 A1* | 2/2008 | Mueller et al. | 257/98 |
| 2008/0128735 A1 | 6/2008 | Yoo et al. | |
| 2008/0265269 A1* | 10/2008 | Yoo et al. | 257/98 |

FOREIGN PATENT DOCUMENTS

| JP | 4201167 | 12/2008 |
| JP | 2009-231569 | 10/2009 |

OTHER PUBLICATIONS

Office Action dated Jun. 24, 2013 issued in corresponding Chinese application No. 201110179990.6, and English translation thereof.

* cited by examiner

*Primary Examiner* — Timor Karimy
(74) *Attorney, Agent, or Firm* — Bacon & Thomas, PLLC

(57) ABSTRACT

A light emitting device includes a light emitting element, a first phosphor which emits a light by being excited by a light emitted from the light emitting element and a second phosphor which emits a light by being excited by the light emitted from the light emitting element and/or the light emitted from the first phosphor. The light emitted from the light emitting element, the light emitted from the first phosphor and the light emitted from the second phosphor are mixed to make an inclination angle of a line, on a chromaticity diagram, connecting a chromaticity coordinate of the light emitted from the first phosphor and a chromaticity coordinate of the light emitted from the light emitting element equal to an inclination angle of an isotemperature line of light of a predetermined color temperature.

6 Claims, 3 Drawing Sheets

LIGHT EMITTING DEVICE

FIELD OF THE INVENTION

The present invention relates to a light emitting element and a light emitting device using a phosphor for converting a wavelength of a light emitted from the light emitting element.

BACKGROUND OF THE INVENTION

Light emitting diodes (LEDs) have been used as light sources of various kinds of electric apparatuses such as a display device, an illumination apparatus and so on because they can emit a high brightness light with low power consumption. With recent practical use of blue (B) LEDs in addition to red (R) and green (G) LEDs, various luminous colors have been achieved by combining these RGB LEDs together or combining LEDs with phosphors for converting a wavelength of a light emitted from the LEDs.

In addition, there has been known a light emitting device which produces a white light by mixing a blue light directly emitted from a blue LED and a yellow light produced by colliding a blue light with a phosphor. In the light emitting device producing the white light as described above, a YAG-based phosphor, for example, is dispersed in a resin material, such as a silicone resin or the like, which seals a blue LED. The YAG-based phosphor converts a wavelength of the blue light emitted from the blue LED into a wavelength of the yellow light.

However, in case where the white light is produced by mixing the blue light and the yellow light, chromaticity coordinates of the mixed lights vary in all directions for each manufactured object if a full width at half maximum of an emission wavelength or a peak wavelength varies, or a concentration of the phosphor contained in the resin material is uneven due to a manufacturing tolerance of the blue LED.

For example, as shown in FIG. 6, a yellow phosphor (chromaticity coordinate $Y(x_Y, y_Y)$) and a red phosphor (chromaticity coordinate $R(x_R, y_R)$) are combined to prepare a phosphor layer of a chromaticity coordinate $RY(x_{RY}, y_{RY})$. In addition, the phosphor layer and a blue LED chip (chromaticity coordinate $B(x_B, y_B)$) are combined to produce a color temperature of 3500K. In this case, a color temperature line set at 5000K of white by the blue LED chip and the yellow phosphor is not in parallel with an isotemperature line (with an angle θ) of 3500K, which results in a deviation in the color temperature.

In recent years, since light emitting devices using LEDs, e.g., a light source for an illumination apparatus, have been frequently used in combination of several of them, there is a need to minimize a manufacturing deviation in a color temperature for each light emitting device.

As one of conventional techniques for reducing color temperature deviations, there has been known a white light emitting device which reduces a color temperature deviation by classifying ranks of blue LEDs based on their emission wavelengths and luminances, and adjusting luminances of phosphors to correspond to the ranked LEDs (see, e.g., Japanese Patent No. 4201167). In this technique, the blue LED and the phosphor are appropriately combined together such that chromaticity coordinate of a light emitted from the blue LED and chromaticity coordinate of a light emitted from the phosphor are plotted on an isotemperature line at desired color temperature. In this way, a chromaticity coordinate deviation in the mixed light is made to lie on the isotemperature line. The isotemperature line refers to a line on a chromaticity diagram on which chromaticity coordinates providing the same color temperature are plotted. If a chromaticity coordinate deviation lies on the isotemperature line, a color temperature deviation is decreased.

Further, there has been known an LED light source including a color temperature adjusting member containing a phosphor (second phosphor) which emits a light of a color different from a color of a light emitted from a phosphor (first phosphor) which emits a yellow light (see, e.g., Japanese Patent Application Publication No. 2009-231569). In this LED light source, even if there is a deviation in an LED emission wavelength, concentration of the first phosphor, and so on, the second phosphor can be used to arbitrarily set a chromaticity coordinate of a final light emitted from the color temperature adjusting member.

The techniques described above may reduce a color temperature deviation of a monochromatic light and perform color temperature adjustment. However, these techniques still have a problem that it is difficult to make the 5000K color temperature line of a white light by the blue LED chip and the yellow phosphor parallel to the 3500K isotemperature line (with the angle θ), which may result in difficulty in implementing desired color temperature.

SUMMARY OF THE INVENTION

In view of the above, the present invention provides a light emitting device including a light emitting element, such as an LED, and a phosphor emitting a light by being excited by a light emitted from the light emitting element, which is capable of reducing a color temperature deviation of a mixed light.

In accordance with an embodiment of the present invention, there is provided a light emitting device including: a light emitting element; a first phosphor which emits a light by being excited by a light emitted from the light emitting element; and a second phosphor which emits a light by being excited by the light emitted from the light emitting element and/or the light emitted from the first phosphor, wherein the light emitted from the light emitting element, the light emitted from the first phosphor and the light emitted from the second phosphor are mixed to make an inclination angle of a line, on a chromaticity diagram, connecting a chromaticity coordinate of the light emitted from the first phosphor and a chromaticity coordinate of the light emitted from the light emitting element equal to an inclination angle of an isotemperature line of light of a predetermined color temperature.

The chromaticity coordinate of the light emitted from the second phosphor may be higher in an x coordinate value than the line, on the chromaticity diagram, connecting the chromaticity coordinate of the light emitted from the light emitting element and the chromaticity coordinate of the light emitted from the first phosphor.

The first phosphor or the second phosphor may be a combination of plural kinds of phosphor particles and may be adjusted to emit a light of a desired chromaticity coordinate.

The light emitting device described above may further include a sealing member made of a resin material which seals the light emitting element. Further, the first phosphor may be dispersed in the resin material of the sealing member.

The light emitting device described above may further include a covering member made of a resin material or glass, the covering member being provided in a light emitting direction of the sealing member. Further, the second phosphor may be dispersed in the resin material or glass of the covering member.

A gap may be formed between the sealing member and the covering member.

In accordance with the present invention, it is possible to provide a light emitting device capable of reducing a color temperature deviation since a deviation of the chromaticity coordinate of the mixture of the light emitted from the light emitting element, the light emitted from the first phosphor and the light emitted from the second phosphor occurs on the isotemperature line.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Figure 1:
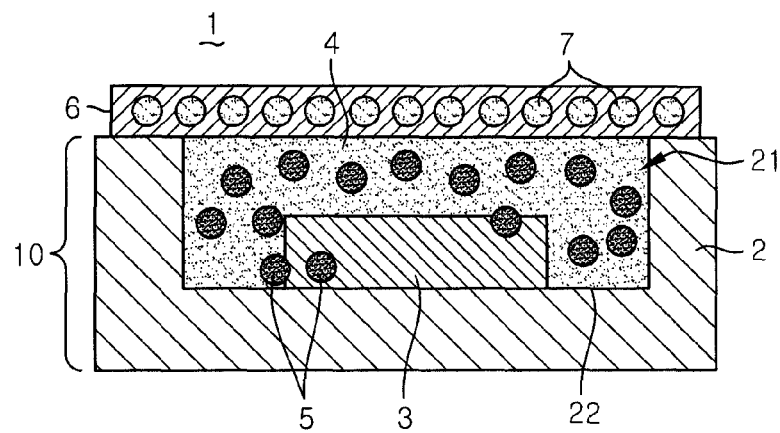
FIG. 1 is a side sectional view of a light emitting device in accordance with an embodiment of the present invention.
Figure 2:
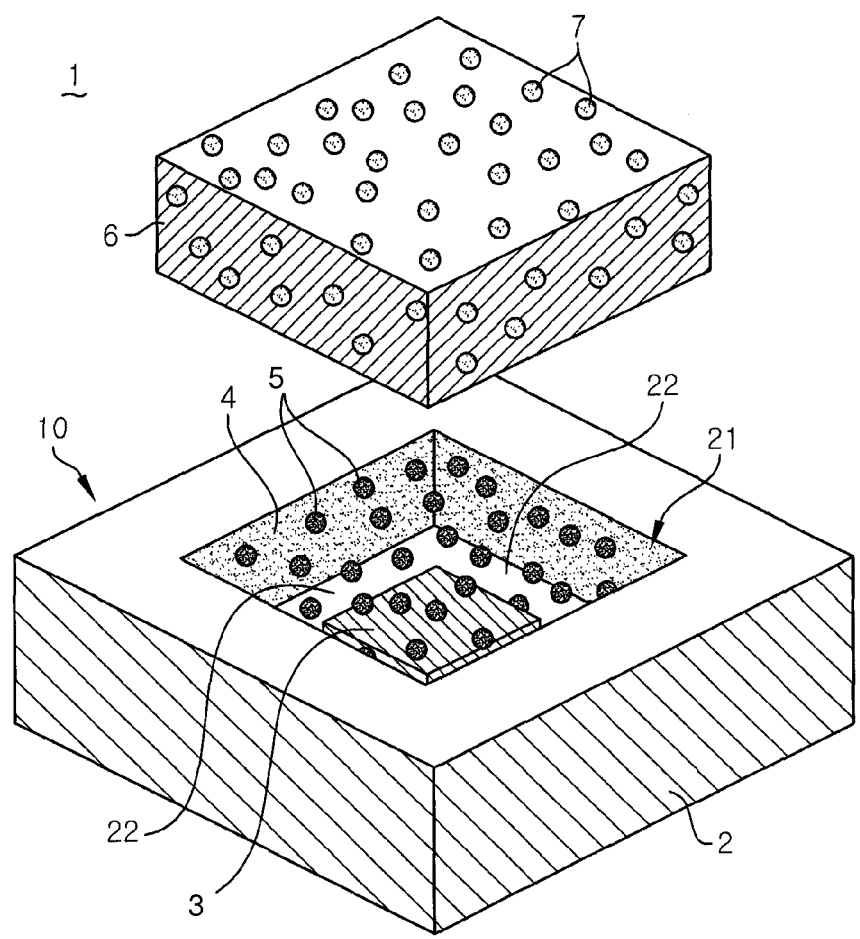
FIG. 2 is a partial exploded perspective view of the light emitting device.

Hereinafter, an embodiment of the present invention will be described with reference to FIGS. 1 to 4 which form a part hereof. As shown in FIGS. 1 and 2, a light emitting device 1 in this embodiment includes a substrate 2 formed with a recess 21, and a light emitting element 3 mounted in the recess 21 of the substrate 2. The recess 21 is filled with a sealing member 4 made of resin in which a first phosphor 5 for emitting a light by being excited by a light emitted from the light emitting element 3 is dispersed. In addition, a package, which includes the light emitting element 3 mounted in the recess 21 of the substrate 2 and the sealing member 4 containing the first phosphor 5 filled in the recess 21, is referred to as an LED package 10. A covering member 6 is provided on the LED package 10 in a light emitting direction of the sealing member 4, and a second phosphor 7 for emitting a light by being excited by the light emitted from the light emitting element 3 or the light emitted from the first phosphor 5 is dispersed in resin material or glass of which the covering member 6 is made.

The substrate 2 is a substrate for use in a general light emitting module. The substrate 2 is made of an insulative metal oxide (including ceramic), e.g., an aluminum oxide ($Al_2O_3$), an insulative metal nitride, e.g., an aluminum nitride (AlN), a metal, a resin, a glass fiber, or the like. The recess 21 is formed substantially on the central portion of the substrate 2 in a quadrangle shape, and the bottom thereof has a mounting surface 22 on which the light emitting element 3 is mounted. The recess 21 may be of a truncated cone shape, a multifaceted pyramidal shape or other shapes without being limited to the quadrangle shape. In addition, if the mounting surface 22 is coated with an insulating layer, the recess 21 may be coated with a metallic material having a high light reflectance.

The mounting surface 22 has a wiring pattern (not shown) which is made of conductive metal such as gold (Au), silver (Ag) or the like and is electrically connected to the light emitting element 3 and an external power terminal. Alternatively, the substrate 2 may include via holes formed therein, through which wirings made of conductive metal are inserted, to provide a wiring pattern (not shown) formed on the rear surface of the substrate 2 instead of the front surface of the substrate 2. These wiring patterns are coated with an insulating layer except for a terminal.

The light emitting element 3 is not particularly limited as long as it can be a light source emitting a desire color light, but may be preferably a GaN-based blue LED chip emitting a blue light. In this embodiment, although the rectangular chip is used as the light emitting element, the shape of the light emitting element is not limited thereto and may be varied depending on the use of the light emitting device 1. The light emitting element 3 includes a light emitting section of a stacked structure including a p-type nitride semiconductor layer, a light emitting layer and an n-type nitride semiconductor layer, a cathode electrode electrically connected to the n-type nitride semiconductor layer, and an anode electrode electrically connected to the p-type nitride semiconductor layer. The cathode electrode and the anode electrode are formed at the bottom side of the element and the light emitting element 3 is mounted on the substrate 2 by soldering the cathode electrode and the anode electrode to element terminals of the wiring pattern via bumps. Although the light emitting element 3 of a face-down type is flip chip-mounted in this embodiment, the light emitting element 3 may be a chip of a face-up type, in which case the element is mounted by using, for example, a die bonding and a wire bonding. In addition, a convex lens for increasing light emitting efficiency may be formed on a light emitting surface of the light emitting element 3.

The sealing member 4 is made of a transparent resin material such as a silicone resin, an epoxy resin or a modified epoxy resin having both properties thereof. The first phosphor 5 is contained in the resin material at a predetermined concentration and the resin material is filled in the recess 21 with a predetermined thickness by means of potting.

As for the first phosphor 5, there is used different kind of phosphor selected based on emission performance such as color temperature required for the light emitting device 1 and emission characteristics such as an emission wavelength of the light emitting element 3, wherein the phosphor is mixed in the resin material at a predetermined concentration. If the GaN-based blue LED is used as the light emitting element 3, some of the blue lights emitted from the light emitting element 3 are absorbed and excited by the first phosphor 5. In this case, for the first phosphor 5, a known yellow phosphor having a peak wavelength in a wavelength range from 500 to 650 nm is appropriately used. This yellow phosphor has an emission peak wavelength in a yellow wavelength range and its emission wavelength range includes a red wavelength range. A YAG-based phosphor having a garnet crystal structure of a composite oxide of yttrium and aluminum can be used as the yellow phosphor, but it is not limited thereto. In addition, the first phosphor 5 may be a combination of various types of phosphor particles.

The covering member 6 may be a sheet-like member formed by molding a phosphor-containing resin material, which is made by mixing a phosphor in a transparent resin material, such as a silicone resin, an epoxy resin, an acrylic resin or the like. Alternatively, the covering member 6 may be formed by coating the resin material on the light emitting element 3 by using a coating method such as printing, inkjet, potting or the like. In addition, the resin material may contain filler or the like to promote a light mixture and increase a thermal conductivity. In addition, a glass may be used for the covering member 6. In this case, glass powder and phosphor particles are mixed and the mixed powder is placed on a framed plate. A phosphor-dispersed glass is formed by melting and solidifying the mixed powder in an atmosphere of low pressure and high temperature.

As for the second phosphor 7, similarly to the first phosphor 5, there is used different kind of phosphor determined based on emission performance such as a color temperature required for the light emitting device 1 and emission characteristics such as an emission wavelength of the light emitting element 3 or the first phosphor 5. The second phosphor 7 is mixed in the resin material or the glass material at a predetermined concentration. If the GaN-based blue LED is used as the light emitting element 3 and the yellow phosphor is used as the first phosphor 5, some of the lights emitted from the light emitting element 3 and/or the first phosphor 5 are absorbed and excited by the second phosphor 7. In this case, for the second phosphor 7, a known orange or red phosphor having a peak wavelength in a wavelength range from 600 to 750 nm is appropriately used. For example, SCASN phosphor particles can be used as the second phosphor. In addition, the second phosphor 7 may be a combination of various types of phosphor particles.

In the light emitting device 1, first, a light emitted from the light emitting element 3 excites the first phosphor 5 dispersed in the sealing member 4 to thereby make the first phosphor 5 emit a light. The light emitted from the light emitting element 3 and the light emitted from the first phosphor 5 incident into the covering member 6 excite the second phosphor 7 dispersed in the covering member 6 to thereby make the second phosphor 7 emit a light. The light emitted from the light emitting element 3, the light emitted from the first phosphor 5 and the light emitted from the second phosphor 7 are mixed in the covering member 6 to be emitted through the light emitting surface of the covering member 6.

Now, a process of adjusting chromaticity coordinates and a color temperature of the light emitted by the light emitting device 1 will be described with reference to FIG. 3. The light emitting device 1 is configured such that an inclination angle $\theta_1$ of a line $L_1$, on a chromaticity diagram, connecting a chromaticity coordinate $Y(x_Y, y_Y)$ of the light emitted from the first phosphor 5 and a chromaticity coordinate $B(x_B, y_B)$ of the light emitted from the light emitting element 3 is made equal to an inclination angle $\theta_2$ of an isotemperature line $L_2$ of a light having a predetermined color temperature by mixing the light emitted from the light emitting element 3, the light emitted from the first phosphor 5 and the light emitted from the second phosphor 7. Here, the term "predetermined color temperature" refers to a desired color temperature of a light emitted from the light emitting device 1, which is 3500K in this embodiment. In addition, a chromaticity coordinate of the light emitted from the second phosphor 7 is denoted by $R(x_R, y_R)$.

An adjustment process of the LED package 10 will now be described. First, a chromaticity coordinate of the light emitted from the light emitting element 3 is measured and plotted on a chromaticity diagram. Then, an isotemperature line of a color temperature of 3500K having an inclination angle $\theta_2$ is drawn to pass through the plotted coordinate, and the type, a concentration, a mixture ratio and so on of the first phosphor 5 are determined such that a chromaticity coordinate of the light emitted from the first phosphor 5 is located on the drawn isotemperature line.

Since a deviation in the chromaticity coordinate of the light emitted from the light emitting element 3 occurs due to a manufacturing tolerance of an LED chip, it is difficult to adjust the deviation in manufacturing the light emitting device 1. On the other hand, the first phosphor 5 is precisely selected and measured in terms of its type, concentration, mixture ratio and so on to be mixed in resin material of which the sealing member 4 is made. Thus, it is relatively easy to precisely adjust the chromaticity coordinate of the light emitted from the first phosphor 5.

Therefore, the inclination of the line, on the chromaticity diagram, connecting the chromaticity coordinate of the light emitted from the first phosphor 5 and the chromaticity coordinate of the light emitted from the light emitting element 3 can be made same as the inclination of the isotemperature line of the color temperature of 3500K.

In case where the light emitted from the first phosphor 5 and the light emitted from the light emitting element 3 are mixed, the adjusted LED package 10 produces a deviation in the chromaticity coordinate of the light along the line $L_1$ having the inclination angle $\theta_1$ which is equal to the inclination angle $\theta_2$ of the isotemperature line $L_2$ of the finally desired color temperature. As a result, a chromaticity coordinate deviation in the LED package 10 can be made to lie on the line $L_1$, while a color temperature deviation is still in an increased state.

Next, an adjustment process of the light emitting device 1 where the covering member 6 in which the second phosphor 7 is dispersed is formed on the light emitting surface of the sealing member 4 of the LED package 10 will be described. Similar to the first phosphor 5, the second phosphor 7 can be precisely selected and measured in terms of its type, concentration, mixture ratio and so on. In addition, since the covering member 6 can be formed with its controlled thickness, shape and so on, the chromaticity coordinate of the light emitted from the second phosphor 7 can be more precisely adjusted than that of the light emitted from the first phosphor 5.

Here, if the intensity of the light emitted from the second phosphor 7 is equal to the intensity of the light emitted from the first phosphor 5 and the light emitting element 3 when the light emitted from the second phosphor 7 is combined therewith, a chromaticity coordinate deviation is shifted toward the chromaticity coordinate $R(x_R, y_R)$ of the second phosphor 7 while keeping the inclination angle $\theta_1$ of the line $L_1$, and the deviation range substantially lies on the isotemperature line $L_2$ of the color temperature. That is, when the light emitted from the second phosphor 7 is combined with the light emitted from the first phosphor 5 and the light emitting element 3, the chromaticity coordinate deviation of the light emitted from the light emitting device 1 occurs along the isotemperature line $L_2$, so that a color temperature deviation is decreased. This results in the light emitting device 1 with a small color temperature deviation.

Further, in this embodiment, the chromaticity coordinate R of the light emitted from the second phosphor 7 is higher in an x coordinate value than the line $L_1$, on the chromaticity diagram, connecting the chromaticity coordinate B of the light emitted from the light emitting element 3 and the chromaticity coordinate Y of the light emitted from the first phosphor 5. That is, the chromaticity coordinate R is located on the right side of the chromaticity diagram. In other words, the combination of the light emitting element 3 and the first phosphor 5 emits a light of a high color temperature, and the second phosphor 7 is combined therewith so that a color temperature of the mixed light is shifted to a low color temperature. Thus, by shifting uneven color temperature along the line $L_1$ in a high color temperature range (the left side of the chromaticity diagram) to a low color temperature range (the right side of the chromaticity diagram), the shifted color temperature can be made to coincide with the isotemperature line $L_2$ in a predetermined color temperature, thereby decreasing the color temperature deviation.

Figure 3:
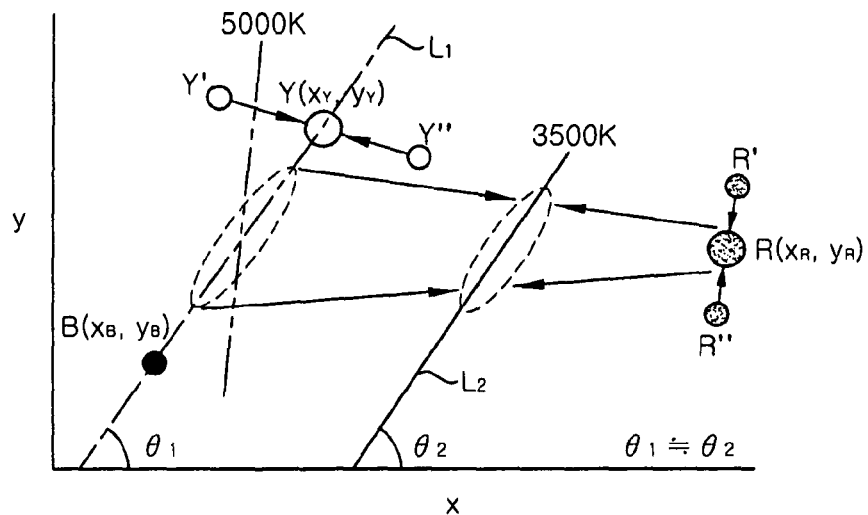
FIG. 3 is a schematic chromaticity diagram used to explain adjustments performed on chromaticity coordinates and color temperatures of a light emitted by the light emitting device.

Further, one kind of the first phosphor 5 may emit a light of a desired chromaticity coordinate $Y(x_Y, y_Y)$, or a combination of plural kinds of phosphors (two kinds in this embodiment) of different chromaticity coordinates (e.g., Y' and Y") may be adjusted to emit the light of the desired chromaticity coordinate $Y(x_Y, y_Y)$ as shown in FIG. 3. One kind of the second phosphor 7 may emit a light of a desired chromaticity coordinate $R(R_Y, R_Y)$, or a combination of plural kinds of phosphors (two kinds in this embodiment) of different chromaticity coordinates (e.g., R' and R") may be adjusted to emit the light of the desired chromaticity coordinate $R(R_Y, R_Y)$.

In this embodiment, the second phosphor 7 shifts the chromaticity coordinate deviation of the light emitted from the LED package 10 to the isotemperature line $L_2$ of the light of the final color temperature. During this shift, a third phosphor (not shown) may be additionally included in either the LED package 10 or the covering member 6 in order to implement a process of shifting the deviation to a separate chromaticity coordinate.

Figure 4:
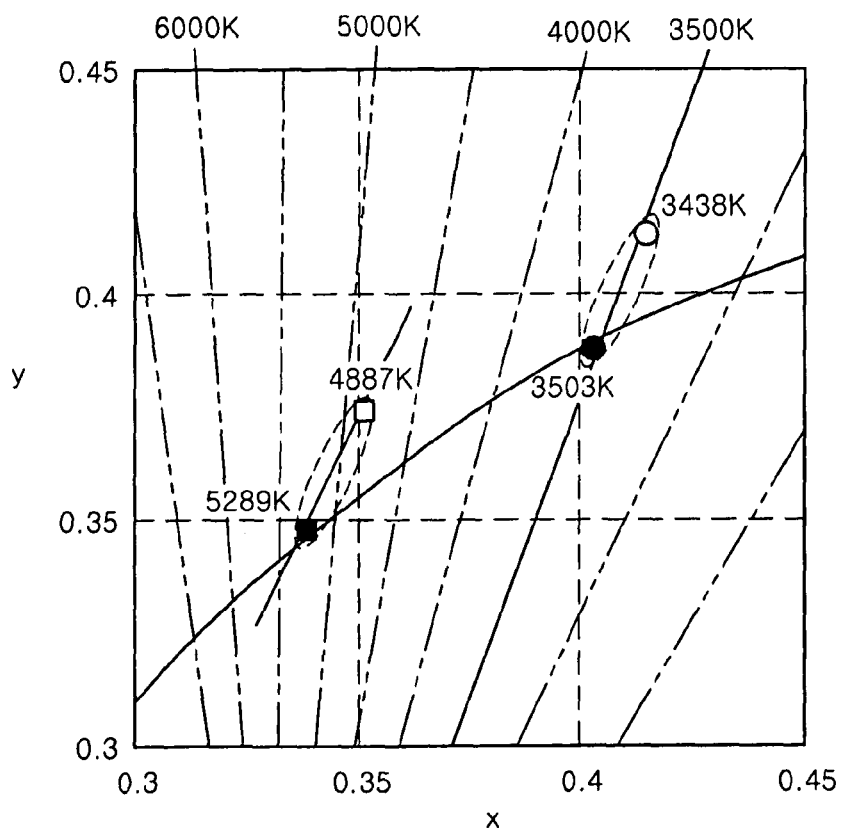
FIG. 4 is an example of a chromaticity diagram of the light emitting device in accordance with the embodiment.

Hereinafter, a manufacturing process of the light emitting device 1 in accordance with the present embodiment, including adjustment of the chromaticity coordinate and the color temperature of the light emitted from the light emitting device 1, will be described in more detail with reference to FIG. 4. In this example, a desired color temperature of the light emitted from the light emitting device 1 is also assumed to be 3500K.

The light emitting element 3 was a GaN-based semiconductor emitting blue light having a peak wavelength of about 450 nm and used a blue LED of a square of 1 mm sides and thickness of about 100 μm. An alumina ceramic package substrate having a gold (Au) plated-wiring pattern was used as the substrate 2. The sealing member 4 was made of silicone resin in which YAG-based phosphor particles were contained by 30 wt % as the first phosphor 5 and was potted in the recess 21 of the substrate 2 to have a thickness of about 100 μm, thereby sealing the light emitting element 3. The LED package 10 thus formed had a color temperature range from about 4800K to 5200K and a chromaticity coordinate deviation occurred along a line having the same inclination angle as that of the isotemperature line of the color temperature of 3500K. This deviation occurred principally due to a deviation of content or a deviation of dispersion of the first phosphor 5, a deviation of the potting amount of the silicone resin, and the like.

Next, the covering member 6 was formed by molding a silicone resin in which SCASN phosphor particles were contained by 3 wt % as the second phosphor 7, into a sheet-like member of a thickness of 0.4 mm. By molding the covering member 6, its thickness precision could be adjusted to an order of several micrometers and time required to inject a mixture of the phosphor and the resin into a mold and complete high temperature hardening thereof could be shortened. Thus, a dispersion deviation or thickness deviation of the phosphor could be decreased and a color temperature deviation due to the second phosphor 7 contained in the covering member 6 could be also decreased. As a result, it was possible to precisely "shift" a chromaticity coordinate deviation to occur along the desired isotemperature line.

The covering member 6 thus formed was combined with the LED package 10, thereby completing the light emitting device 1. A chromaticity coordinate deviation of light emitted from such light emitting device 1 occurred along the isotemperature line of the color temperature of 3500K, and the color temperature deviation thereof hardly occurred. Therefore, the light emitting device 1 having a small color temperature deviation could be obtained. In addition, type, concentration and the like of the second phosphor 7 may be selected to allow a chromaticity coordinate deviation of the LED package 10 to be "shifted" to a long wavelength side in accordance with a Planckian locus. This results in the light emitting device 1 capable of emission of natural color light.

Figure 5:
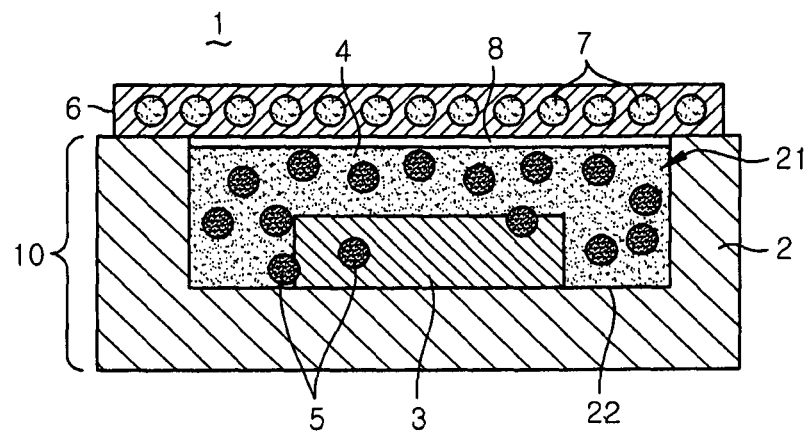
FIG. 5 is a side sectional view of a light emitting device in accordance with a modification of the present invention.
Figure 6:
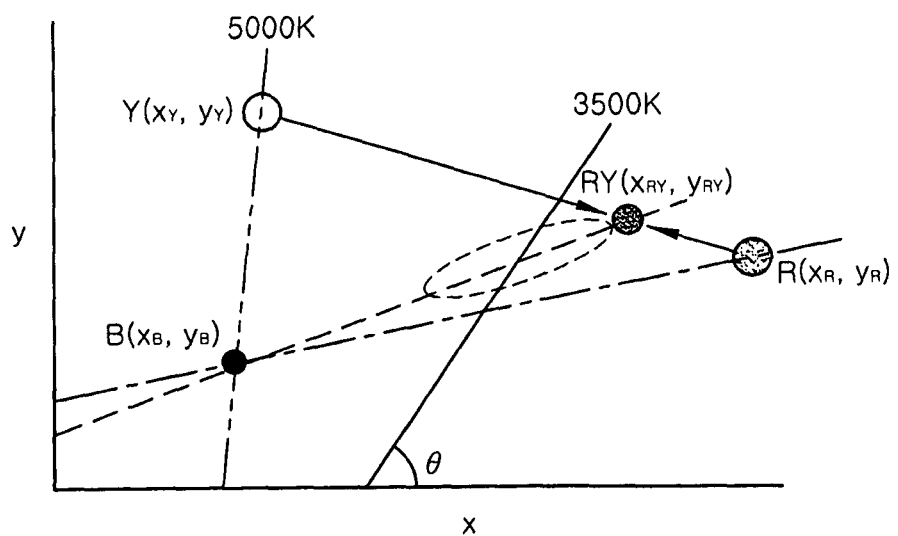
FIG. 6 is a chromaticity diagram used to explain why a deviation in color temperature occurs in a conventional light emitting device.

Hereinafter, a light emitting device in accordance with a modification of the present embodiment will be described with reference to FIG. 5. The light emitting device 1 in this modification has a gap 8 formed between the sealing member 4 and the covering member 6. Other configuration in this modification is the same as the above-described embodiment. With this configuration, some of lights directing to the LED package 10 among the lights emitted from the second phosphor 7 in the covering member 6 are totally reflected by an interface between the covering member 6 and the gap 8. This results in higher possibility of emission through the light emitting surface of the covering member 6 and increased efficiency of light utilization. In addition, as the totally reflected lights further mixed in the covering member 6, a color temperature of light through the light emitting surface of the covering member 6 can be further homogenized. In addition, the gap 8 may be filled with filler or the like to increase light emission efficiency or improve heat dissipation.

In addition, the present invention can be modified in various ways without being limited to the above-described embodiment as long as the inclination angle $\theta_1$ of the line $L_1$, on the chromaticity diagram, connecting the chromaticity coordinate Y of the light emitted from the first phosphor 5 and the chromaticity coordinate B of the light emitted from the light emitting element 3 can be equal to the inclination angle $\theta_2$ of the isotemperature line $L_2$ of the light having the desired color temperature. In addition, the covering member 6 may be a member formed of two or more resin layers in which different phosphors are respectively dispersed, and they may be combined to have the same function as the second phosphor 7 in the above-described embodiment. Furthermore, for example, a light conversion member (not shown) containing a fourth phosphor to further convert an emission wavelength of the light emitting device 1 may be provided.

While the invention has been shown and described with respect to the embodiments, it will be understood by those skilled in the art that various changes and modification may be made without departing from the scope of the invention as defined in the following claims.

What is claimed is:

1. A light emitting device comprising:
   a light emitting element;
   a first phosphor which emits a light by being excited by a light emitted from the light emitting element; and
   a second phosphor which emits a light by being excited by the light emitted from the light emitting element and/or the light emitted from the first phosphor,
   wherein the light emitting element, the first phosphor, and the second phosphor are configured such that, on a chromaticity diagram, an inclination angle of a straight line, connecting chromaticity coordinates of the light emitted from the first phosphor and chromaticity coordinates of the light emitted from the light emitting element is substantially equal to an inclination angle of an isotemperature line of light of a predetermined color temperature produced by mixing the light emitted from the light emitting element, the light emitted from the first phosphor and the light emitted from the second phosphor.

2. The light emitting device of claim 1, wherein, on the chromaticity diagram, an x coordinate of the light emitted from the second phosphor is greater than an x coordinate of any point on the straight line connecting the chromaticity coordinates of the light emitted from the light emitting element and the chromaticity coordinates of the light emitted from the first phosphor.

3. The light emitting device of claim 1, wherein the first phosphor or the second phosphor is a combination of plural kinds of phosphor particles and is adjusted to emit a light of a desired chromaticity coordinate.

4. The light emitting device of claim 1, further comprising a sealing member made of a resin material which seals the light emitting element, wherein the first phosphor is dispersed in the resin material of the sealing member.

5. The light emitting device of claim 4, further comprising a covering member made of a resin material or glass, the covering member being provided in a light emitting direction of the sealing member, wherein the second phosphor is dispersed in the resin material or glass of the covering member.

6. The light emitting device of claim 5, wherein a gap is formed between the sealing member and the covering member.

* * * * *